United States Patent [19]

Itoh et al.

[11] Patent Number: 5,275,970
[45] Date of Patent: Jan. 4, 1994

[54] METHOD OF FORMING BONDING BUMPS BY PUNCHING A METAL RIBBON

[75] Inventors: Masataka Itoh; Hiroshi Honmou, both of Tokyo, Japan

[73] Assignee: NEC Corporation, Tokyo, Japan

[21] Appl. No.: 777,903

[22] Filed: Oct. 17, 1991

[30] Foreign Application Priority Data

Oct. 17, 1990 [JP] Japan .................. 2-278088

[51] Int. Cl.⁵ .................. H01L 21/283; H01L 21/603
[52] U.S. Cl. .................. 437/183; 437/188; 437/202; 437/204; 228/254; 228/180.21; 29/845
[58] Field of Search ............ 437/183, 187, 188, 203, 437/204, 214, 222; 228/123, 180.2, 14, 245, 13, 254; 156/261; 29/845; 257/737, 738, 780

[56] References Cited

U.S. PATENT DOCUMENTS

| | | |
|---|---|---|
| 3,719,981 | 3/1973 | Steitz .................. 437/183 |
| 4,693,770 | 9/1987 | Hatada .................. 228/180.2 |
| 4,871,110 | 10/1989 | Fukasawa et al. .................. 228/245 |
| 4,906,823 | 3/1990 | Kushima et al. .................. 228/245 |
| 5,118,370 | 6/1992 | Ozawa .................. 156/261 |

FOREIGN PATENT DOCUMENTS

| | | |
|---|---|---|
| 4322726 | 9/1968 | Japan .................. 437/183 |
| 54022162 | 2/1979 | Japan .................. 228/14 |
| 6225435 | 2/1987 | Japan .................. 437/183 |
| 63291428 | 11/1988 | Japan .................. 437/183 |
| 63308351 | 12/1988 | Japan .................. 437/183 |
| 1112741 | 5/1989 | Japan .................. 437/183 |
| 1308038 | 12/1989 | Japan .................. 437/183 |
| 212936 | 1/1990 | Japan .................. 437/183 |
| 254932 | 2/1990 | Japan .................. 437/183 |

OTHER PUBLICATIONS

*Webster's Ninth New Collagiate Dictionary*, Merriam Webster Inc., 1985. p. 1004.
Katsura et al., "A Micro Interconnection Technique Using Solder Bumps For High-Speed Optical Devices", IMC 1990 Proceedings, pp. 105-108 (1990).

*Primary Examiner*—Olik Chaudhuri
*Assistant Examiner*—David E. Graybill
*Attorney, Agent, or Firm*—Leydig, Voit & Mayer

[57] ABSTRACT

Disclosed is a method of forming bonding metal bumps on electrodes of a submount for use with an optical device array. Small bonding metal pieces are arranged on a transfer piece resting substrate so as to be aligned with the electrodes of the submount. Next, the bonding metal pieces thus arranged are transferred onto respective electrodes of the submount. In one embodiment, bonding metal pieces are preferably formed by punching a ribbon-shaped bonding metal and respectively fixed by a force of the punching operation directly onto the electrodes of the submount.

7 Claims, 2 Drawing Sheets

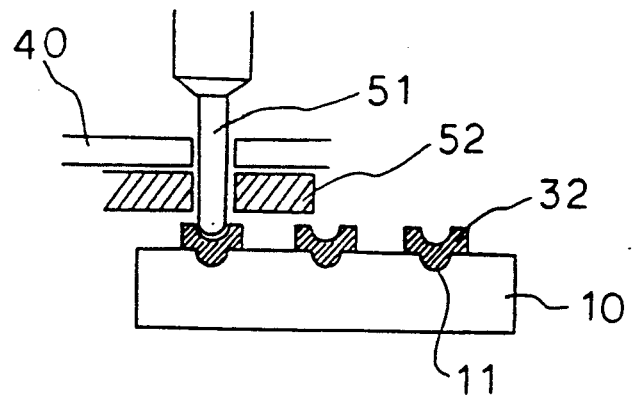
F I G. 4
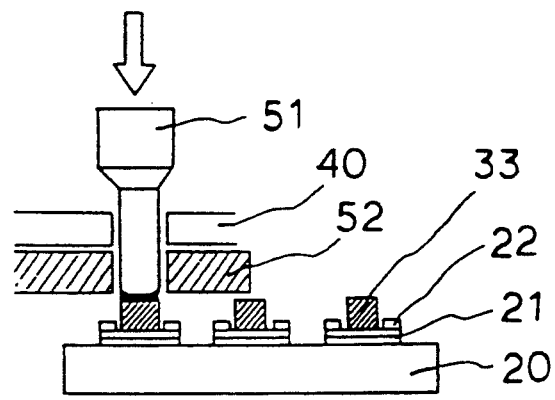
F I G. 5

METHOD OF FORMING BONDING BUMPS BY PUNCHING A METAL RIBBON

BACKGROUND OF THE INVENTION

1. Field of the Invention

This invention relates to a method of forming bonding metal bumps for fixing an optical device array on the surface of a submount which is employed in a parallel transmission optical module or the like used for optical communication purpose.

2. Description of the Prior Art

Recently, applications for optical communications have been increasingly expanding so that optical elements such as optical fiber, laser diode (LD), light emitting diode (LED), photo-diode (PD), optical switch, optical modulator, optical isolator, optical waveguide and so on are made increasingly functional. In order to make the transmission of larger amounts of information possible, a method has been proposed so that the data transmission can be carried out in parallel and in real time between computer terminals, exchangers and/or large-scale computers. As the device to be used for the purpose of parallel transmission of information, a parallel transmission optical module where a plurality of light emitters and/or a plurality of light receivers are used integrally with a plurality of optical fibers is known.

The parallel transmission optical module generally uses, as the light emitter, a LED/LD array having a plurality of either LEDs or LDs arranged in a monolithic manner on a semiconductor substrate. On the other hand, it uses, as the light receiver, a PD array which has a plurality of PDs arranged thereon in the same manner as above. On the back surface of each of these optical device arrays, a plurality of electrodes made of gold (Au) or the like are provided for electrical connection or positioning purposes. The optical device arrays thus prepared are mounted on a submount which becomes an interface with an external electric circuit. The submount is made of alumina ($Al_2O_3$), aluminum nitride (AlN) or the like, and on one side surface of which are patterned a plurality of layers with chromium (Cr)/nickel (Ni), chromium (Cr)/gold (Au) or the like by the thin film forming process thereby to provide an electric interconnection having a plurality of layers disposed in a laminated pattern. At the connecting portions of the electric interconnection with the optical device arrays, electrodes are patterned thereby to connect the optical device arrays via the electrodes to the submount.

In case of mounting the optical device array on the submount, it may be warped in general due to the difference in layer structure between the front surface and back surface of the array itself. In order for electrodes, each with a thickness of 2 to 3 $\mu$m, provided on the array and the electrodes, each with a thickness of 2 to 3 $\mu$m, formed on the submount to be in perfect contact with each other, a pressure is required to be applied. In this case, however, the arrays are formed on the substrate made of such fragile materials as gallium arsenide (GaAs), indium phosphide (InP) and so on. Thus the application of a pressure may cause them to be damaged. In order to overcome such a problem, conventionally, bonding metal bumps each having a height of about 20 to 30 $\mu$m are provided at the connecting portions of either the submount or the array. This allows the warp of the array to be absorbed so that connection can be provided via the bumps without applying a pressure. The bonding metal to be used for this purpose, for example, lead (Pb) - tin (Sn) alloy, gold (Au) - tin (Sn) alloy and so on is known. In connecting such members as shown above by the reflow bonding technique, the bonding metal bumps exert the self-alignment effect themselves by surface tension, so that these members can be positioned very accurately.

In addition, a dam made of polyimide resin or the like is provided in advance so as to surround each of the connecting portions of them thereby to form a cavity. The bonding metal bumps are respectively arranged into the cavities thus formed, so that the bonding metal bumps can be prevented from being drained out therefrom when melted by a heating.

In the case of the parallel transmission optical module, the formation of bonding metal bumps on the submount can be easily achieved by using a Pb-Sn alloy as the bonding metal and arranging it onto each of the electrodes formed on the surface of the submount by plating process. This method, there generates a slight variation per hour (about 1 $\mu$m) at the portions provided on the array to be connected with the electrodes. Thus, it is not preferable to be used for connecting a highly reliable optical device requiring highly accurate positioning on a long term basis.

Therefore, Au-Sn alloy which does not generate such variation per hour has been used conventionally. In this case, however, the mixing ratio of Au and Sn is required to be controlled precisely, so that the plating technique is difficult to apply. As a result, generally, the Au-Sn alloy is deposited onto the electrodes in a film form using a vacuum deposition technique. However, many processes are unavoidably required to form a film with a thickness of several tens of micrometers by the vacuum deposition technique, decreasing productivity.

A method that the Au-Sn alloy is arranged in the ball form onto each of the electrodes formed on the submount will be considered. However, the arrangement of small balls each about 100 $\mu$m in diameter one by one on each of the electrodes is extremely sophisticated, and thus not practical. So another method will be considered in which a large number of balls made of Au-Sn alloy are scatteredly provided over the submount. Then, unnecessary balls not arranged on the electrodes are removed by shaking. Necessary balls arranged on each of the electrodes remain.

However, this method may result in a fault in connection caused by some balls remaining while not arranged on the electrodes.

Accordingly, an object of this invention is to provide a method of easily and precisely forming bonding metal bumps on a submount for use with an optical device array.

Another object of this invention is to provide a method of forming bonding metal bumps on a submount for use with an optical device array, which is extremely high in productivity and low in cost.

SUMMARY OF THE INVENTION

In a first aspect, the method of this invention is characterized in that, the bonding metal pieces are arranged on the surface of a transfer piece resting member so as to be aligned with the electrodes of a submount, then, transferred respectively onto the electrodes of the submount and thereafter, heated for melting. When melted, each of the bonding metal pieces is formed into a ball-shaped bump by the surface tension effect and bonded to the corresponding one of the electrodes of the submount. The method of this invention makes it possible to form the bonding metal bumps easily and accurately even where a bonding metal or submount cannot easily accomodate the plating or vacuum deposition technique.

The shape of the bonding metal pieces are not particularly limited, however, in a preferred embodiment of this invention, it is ball-shaped. The bonding metal pieces are temporarily positioned into the recesses formed in the surface of the transfer piece resting member so as to be aligned with the electrodes of the submount when it is placed thereon with its top side down.

In another preferred embodiment of this invention, the bonding metal pieces are formed by punching a ribbon-shaped bonding metal using a punch and die or the like. The bonding metal pieces thus obtained may be temporarily positioned respectively into the recesses formed in the surface of the transfer piece resting member by using another process, however, it is preferable to position them temporarily one by one in every punching operation respectively into the recesses with the help of a surplus force of punching operation. By doing this, each of the bonding metal pieces can be temporarily positioned onto the piece resting member immediately after being punched, largely contributing to the improvement of productivity.

In a second aspect, the method of this invention is characterized by in that the bonding metal pieces are formed from the ribbon-shaped bonding metal using a punch and die or the like and are respectively arranged directly onto the electrodes of the submount, and then melted by heating. With this method, the bonding metal pieces are not arranged on the transfer piece resting member. Thus, not only is the piece resting member not required, but the productivity can be further improved as compared with the method of the first aspect.

In method of this aspect, it is preferable to urge the punched bonding metal pieces directly onto the electrodes of the submount by surplus force of the punching operation. Preferably, at least one of the punch, the submount and the ribbon-shaped bonding metal is preheated. The bonding metal pieces thus punched are thermocompressively bonded by the surplus force of the punching operation respectively to the electrodes of the submount. Thus, the method is capable of bonding the bonding metal pieces reliably onto the electrodes of the submount.

BRIEF DESCRIPTION OF THE DRAWINGS

FIG. 4 is a schematic cross-sectional view showing a method according to a second embodiment of this invention, in which the bonding metal pieces are formed by punching with a micro punch and die thereby to position them temporarily onto the transfer piece resting substrate.

FIG. 5 is a schematic cross-sectional view showing a method according to a third embodiment of this invention, in which the bonding metal pieces are formed by punching with the micro punch and die thereby to temporarily position them directly onto the submount.

DESCRIPTION OF THE PREFERRED EMBODIMENTS

Thereinafter, the preferred embodiments of this invention will be described while referring to the attached drawings.

Figure 1:
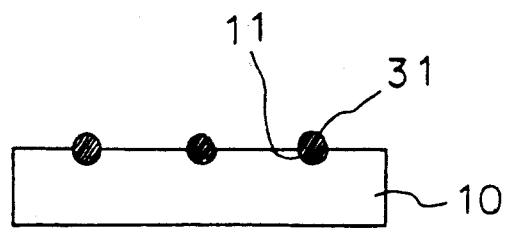
FIG. 1 is a schematic cross-sectional view showing a method according to a first embodiment of this invention, in which bonding metal balls are temporarily positioned respectively in recesses formed in the surface of a transfer piece resting substrate.
Figure 2:
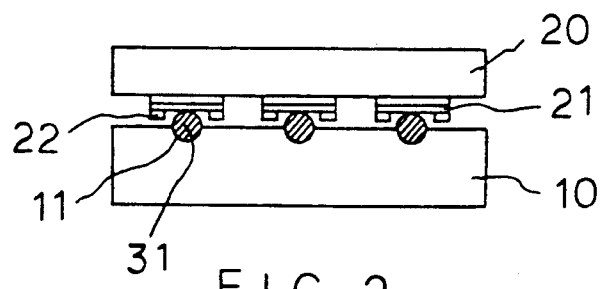
FIG. 2 is a schematic cross-sectional view showing the state that when the bonding metal balls on the piece resting substrate are to be transferred respectively onto the electrodes formed on the surface of a submount.
Figure 3:
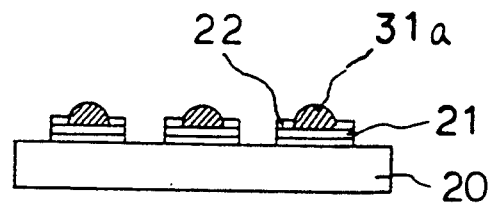
FIG. 3 is a schematic cross-sectional view showing the state that the bonding metal balls transferred onto the submount are melted thereby to be formed into bumps.

FIGS. 1 to 3 schematically illustrate a method according to a first embodiment of this invention. In FIGS. 1 to 3, a transfer piece resting substrate 10 temporarily rests on its surface the bonding metal balls 31 which are to be formed into bumps. The balls 31 thus rested thereon are transferred onto a submount 20 when required. The transfer piece resting substrate 10 is made of such a metal as aluminum that is not adhesive to the soft solders such as a Pb-Sn alloy, Au-Sn alloy and the like and has a plurality of recesses 11 formed in its surface for receiving the balls 31 thereinto. The recesses 11 are respectively shaped substantially in hemisphere with a diameter of about 100 $\mu$m and a depth of about 100 $\mu$m and receive the bonding metal balls 31 each having a diameter of about 100 $\mu$m for the temporarily posisioning purpose. These recesses 11 are arranged such that when the substrate 10 is placed, with its top side down, onto the submount 20, they are allowed to be aligned respectively with electrode pads 21 formed on the submount 20.

The submount 20 has on its surface a plurality of the electrode pads 21 each having a dam 22 made of polyimide resin provided so as to surround it for preventing the melted bonding metal from being drained out. The electrode pads 21 each is shaped in square having a size of about 200 ×200 $\mu$m, on the surface of which a thin film of Au is coated. The bonding metal bumps each is formed in a cavity prepared by surrounding the electrode pad 21 with the dam 22. The depth of the cavity thus prepared is properly set in accordance with the size of bumps to be formed.

In the case of forming the bonding metal bumps on the surface of the submount 20 using the transfer piece resting substrate 10 structured as shown above, first of all, the bonding metal balls 31 are rested respectively into the recesses 11 formed in the surface of the substrate 10, as shown in FIG. 1. Here, as the bonding metal ball 31, an Au-Sn alloy ball having a diameter of about 100 $\mu$m is used. The process of resting the balls 31 respectively into the recesses 11 may be in accordance with any known process. In this embodiment, a large number of the bonding metal balls 31 are scatteredly provided over the recesses 11 from the upper direction of the substrate 10 by handling with a pincette or the like. Then, unnecessary balls 31 not in the recesses 11 are removed by shaking by applying a small vibration to the substrate 10.

Next, the submount 20 is approached from the upper direction, with its surface having the electrode pads 21 down, to the transfer piece resting substrate 10 having the bonding metal balls 31 rested in the recesses 11, and as shown in FIG. 2. The submount 20 is placed on the substrate 10 in such a manner that each of the electrode pads 21 of the submount 20 is vertically aligned with the corresponding one of the bonding metal balls 31 of the substrate 10. At this time, each of the balls 31 contacts with the surface of the corresponding one of the electrode pads 21.

Then, either the submount 20 or the transfer piece resting substrate 10, or the whole atmosphere is heated to a temperature of about 280° C. which is the melting point of the Au-Sn alloy to be used for the bonding metal to melt the balls 31. The metal of the balls 31 is alloyed with the gold of the Au films formed on the surface of the electric pad 21 of the submount 20, thus bonding the balls 31 respectively to the electrode pads 21. On the other hand, the piece resting substrate 10 is made of aluminum with no adhesion with the Au-Sn alloy. Thus, the substrate 10 is never bonded thereto. Thereafter, the device is cooled to an appropriate temperature below 280° C. and the substrates 10 and the submount 20 are separated from each other. As a result, the balls 31 are separated from the substrate 10. Thus, the transferring process of the bonding metal balls 30 is finished.

Finally, the submount 20 having the bonding metal balls 31 is heated to a temperature exceeding 280° C. to melt the balls 31 completely. As a result, the melted balls 31 are spreadingly flowed respectively in the cavities of the electrode pads 21. Thus, a Au-Sn alloy bump 31a with a height of about 20 to 30 μm can be formed on each of the electrode pads 21, as shown in FIG. 3.

After the formation of the bumps 31a respectively on the electrode pads 21, the electrodes of an optical device array are arranged thereon. The optical device array is fixedly bonded through the bumps 31a to the submount 20 by the reflow bonding process. This process is performed by using a known method.

FIG. 4 shows a method according to a second embodiment of this invention, in which the temporarily positioning of the bonding metal pieces 32 onto the piece resting substrate 10 can be easily performed. In FIG. 4, the reference numeral 51 indicates a micro punch with a diameter of about 120 μm, 52 indicates a micro die with a diameter of about 140 μm, and 40 indicates a Au-Sn alloy ribbon with a thickness of about 50 μm.

In this embodiment, the Au-Sn alloy ribbon 40 is punched into a small piece 32 with the punch 51 and the die 52. The punched piece 32 of the Au-Sn alloy is formed in the recess 11 of the transfer piece resting substrate 10. In this case, the substrate 10 is placed under the punch 51 and the die 52, and positioned so that the recess 11 in which the bonding metal piece 32 is to be provided is just under the punch 51. The substrate 10 and the punch 51 are relatively moved synchronously with the punching operation, and the bonding metal piece 32 thus punched is urgedly formed into the recess 11 of the substrate 10 in a successive manner. Thus, the piece 32 thus formed is rested successively into the recess 11 by the surplus force of punching operation. The diameter of the piece 32 is made such as to be larger than the diameter of the recess 11, so that the piece 32 is rested into the recess 11 under such a state that the peripheral portion thereof is extended outside the periphery of the recess 11. By the urging force developed by the punching operation, a recess portion is formed in the top surface of the piece 32. The processes after the temporary positioning of the pieces 32 respectively on the piece resting substrate 10 are of the same as in the first embodiment.

With the method according to the second embodiment, the temporary positioning of the bonding metal pieces 32 onto the transfer piece resting substrate 10 can be performed by an easy punching process, so that this method makes it possible to largely improve the productivity as compared with the method according to the first embodiment in which a large amount of the bonding metal balls 31 are to be handled in an one-by-one manner with a pincette or the like.

FIG. 5 shows a third embodiment of this invention. In this embodiment, the bonding metal pieces 33 formed by the same punching process as in the second embodiment are provided directly onto the submount 20. The Au-Sn alloy ribbon 40 is subjected to the punching operation with the punch 51 and the die 52 to form a small piece 33 by the same procedures as in the second embodiment. In this case, however, different from the second embodiment, the submount 20 is heated to about 200° C. and placed under the punch 51 and the die 52, and then positioned so that the electrode pad 21 on which the piece 33 is to be provided is just under the punch 51. The submount 20 and the punch 51 are relatively moved synchronously with the punching operation. The punched piece 33 is urgedly provided by the surplus force of the punching operation onto the electrode pad 21 of the submount 20 in a successive manner. The bonding metal pieces 33 thus provided thereon are thermocompressively bonded to the electrode pads 21 successively. The diameter of the piece 33 is properly set to a suitable size to be contained in the dam 22 surrounding the electrode pad 21.

Since the submount 20 is heated to about 200° C. in advance, the bonding metal piece 33 of Au-Sn alloy is alloyed with the Au film of the electrode pad 21 to form an alloy layer by the thermocompression bonding, so that the piece 33 can be fixed to the electrode pad 21. Then, the pieces 33 are heated to the melting point of 280° C., resulting in the formation of the bonding metal bump 31a as shown in FIG. 3.

In the third embodiment, the bonding metal bumps 31a can be formed on the submount 20 without passing through the transferring process of the pieces 33, so that the number of fabricating processes can be advantageously reduced as compared with the second embodiment.

In addition, the submount 20 is pre-heated in this embodiment, but it is not limited thereto, the punch 51 and/or the ribbon 40 may be pre-heated instead of the same, or all of them may be subjected to pre-heating.

In the first to third embodiments, an Au-Sn alloy is employed as the bonding metal, but it is not limited thereto, other kinds of bonding metal may be employed.

What is claimed is:

1. A method of forming bonding metal bumps on electrodes of a submount for use with an optical device array comprising the steps of:

arranging bonding metal pieces which are formed by punching a ribbon-shaped bonding metal respectively onto said electrodes of said submount; and heating said bonding metal pieces arranged on said electrodes for melting, wherein said bonding metal pieces are respectively arranged by a force of said punching operation directly onto said electrodes, wherein at least one of a punch, said submount, and said ribbon-shaped bonding metal is pre-heated, and said bonding metal pieces are thermocompressively bonded to respective electrodes by said force.

2. A method of forming a plurality of bonding metal bumps on a plurality of electrodes of a submount comprising:

forming a plurality of bonding metal pieces by punching a ribbon-shaped bonding metal disposed between a punch and a die by using a combination of said punch and said die to dispose each bonding metal piece of the plurality of bonding metal pieces onto respective electrodes of the plurality of electrodes of said submount;

fixing each bonding metal piece of said plurality of bonding metal pieces onto each of the respective electrodes by pressing each bonding metal piece against the electrode using said punch; and heating said plurality of bonding metal pieces pressed onto said plurality of electrodes to form said plurality of bonding metal bumps by melting said plurality of bonding metal pieces.

3. The method as claimed in claim 2 wherein said bonding metal consists of an alloy selected from the group consisting of an Au-Sn alloy and a Pb-Sn alloy.

4. The method as claimed in claim 2 wherein at least one of said punch, said submount, and said ribbon-shaped bonding metal is pre-heated and each of said plurality of bonding metal pieces is thermocompressively bonded to each of the respective electrodes by a pressing force of said punch.

5. A method of forming bonding metal bumps on a plurality of electrodes of a submount comprising:

punching a ribbon-shaped bonding metal sandwiched between a punch and a die by using a combination of said punch and said die to produce a plurality of bonding metal pieces, each bonding metal piece of said plurality of bonding metal pieces being passed through a hole of said die and being disposed onto respective electrodes of the plurality of electrodes, at least one of said punch, said submount, and said ribbon-shaped bonding metal being pre-heated;

pressing each of said bonding metal pieces onto respective electrodes to form a thermocompressive bond; and then, heating the plurality of bonding metal pieces having the thermocompressive bond to form said bonding metal bumps on said plurality of electrodes by melting said plurality of bonding metal pieces.

6. A method of forming bonding metal bumps on a plurality of electrodes of a submount comprising the steps of:

punching a ribbon-shaped bonding metal of an alloy selected from the group consisting of an Au-Sn alloy and a Pb-Sn alloy using a combination of a punch and a die to produce a plurality of bonding metal pieces, relative movement between said punch and said submount being synchronous with the punching operation for disposing each bonding metal piece of the plurality of metal pieces on respective electrodes of the plurality of electrodes of said submount;

fixing each of said bonding metal pieces onto the respective electrodes by pressing each of said bonding metal pieces using said punch; and heating each of said bonding metal pieces fixed onto said electrodes of said submount to form said bonding metal bumps on said electrodes by melting said plurality of bonding metal pieces.

7. A method of forming bonding metal bumps on electrodes of a submount for use with an optical device array comprising the steps of:

punching a ribbon-shaped bonding metal disposed between a punch and a die by using a combination of said punch and said die to produce a plurality of bonding metal pieces on said electrodes of said submount, respectively, said bonding metal being an alloy selected from the group consisting of Au-Sn and Pb-Sn, said punch and said submount being relatively moved synchronously with a punching operation;

pre-fixing each of said bonding metal pieces on each of said electrodes, respectively, by pressing said bonding metal pieces by using said punch; and heating said bonding metal pieces fixed on said electrodes of said submount to form said bonding metal bumps on said electrodes by melting said bonding metal pieces.

* * * * *